(12) United States Patent
Forbes et al.

(10) Patent No.: US 10,651,953 B2
(45) Date of Patent: May 12, 2020

(54) LOW GAIN LISTEN

(71) Applicant: Avago Technologies International Sales Pte. Limited, Singapore (SG)

(72) Inventors: Marcellus Forbes, San Jose, CA (US); Vijay Sundararajan, Sunnyvale, CA (US); Arya Behzad, San Jose, CA (US); Bijoy Bhukania, Bangalore (IN); Rishabh Agarwal, Bengaluru (IN)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 16/176,928

(22) Filed: Oct. 31, 2018

(65) Prior Publication Data

US 2019/0132063 A1    May 2, 2019

Related U.S. Application Data

(60) Provisional application No. 62/580,604, filed on Nov. 2, 2017.

(51) Int. Cl.
*H04B 17/10* (2015.01)
*H04B 17/13* (2015.01)
*H04B 1/18* (2006.01)
*H04B 17/336* (2015.01)
*H03F 3/189* (2006.01)
*H04B 17/391* (2015.01)
*H04W 52/28* (2009.01)
*H04B 17/318* (2015.01)
*H04B 1/10* (2006.01)

(52) U.S. Cl.
CPC .......... *H04B 17/102* (2015.01); *H03F 3/189* (2013.01); *H04B 1/1027* (2013.01); *H04B 1/18* (2013.01); *H04B 17/13* (2015.01); *H04B 17/318* (2015.01); *H04B 17/336* (2015.01); *H04B 17/391* (2015.01); *H04W 52/286* (2013.01); *H03F 2200/294* (2013.01)

(58) Field of Classification Search
CPC .... H04B 17/102; H04B 17/13; H04B 17/318; H04B 17/336; H04B 17/391; H04B 1/1027; H04B 1/18; H03F 3/189; H04W 52/286
See application file for complete search history.

(56) References Cited

U.S. PATENT DOCUMENTS

| | | | | |
|---|---|---|---|---|
| 2007/0147553 | A1* | 6/2007 | Bhat | H03F 1/0272 375/345 |
| 2008/0003967 | A1* | 1/2008 | Kuroda | H03G 3/3068 455/232.1 |
| 2012/0314712 | A1* | 12/2012 | Sato | H03G 1/0088 370/401 |

\* cited by examiner

*Primary Examiner* — Nguyen T Vo
(74) *Attorney, Agent, or Firm* — Xsensus LLP

(57) ABSTRACT

A wireless communication device includes an antenna to receive a signal, a low noise amplifier, and circuitry that determines the power level of the signal. The circuitry also determines whether the signal includes a packet, and causes the low noise amplifier to amplify the signal when the signal includes a packet and the power level of the signal is below a threshold. The circuitry also causes the low noise amplifier to be bypassed when the signal does not include a packet, or the power level of the signal is above the predetermined threshold and the signal includes a packet.

17 Claims, 6 Drawing Sheets

LOW GAIN LISTEN

BACKGROUND

Field

The present disclosure relates to a low gain listen wireless communication system and associated methodology for reducing power consumption. Specifically, the present disclosure relates to a low gain listen wireless system in which the system's low noise amplifier may be bypassed in order to reduce the system's power consumption.

Description of the Related Art

Packet radio systems spend significant time listening for carriers during, for example, carrier state searches. During this time the system waits for reception of incoming data (a packet, for example). Since the system may not know the level of the received signal strength indicator (RSSI) of a future packet, the system must configure its radio for the lowest noise figure (NF) in order to maximize the probability of correctly receiving the packet. This results in significant power consumption in part due to the operation of the low noise amplifier (LNA) of the system, which is needed in the lowest NF configuration.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
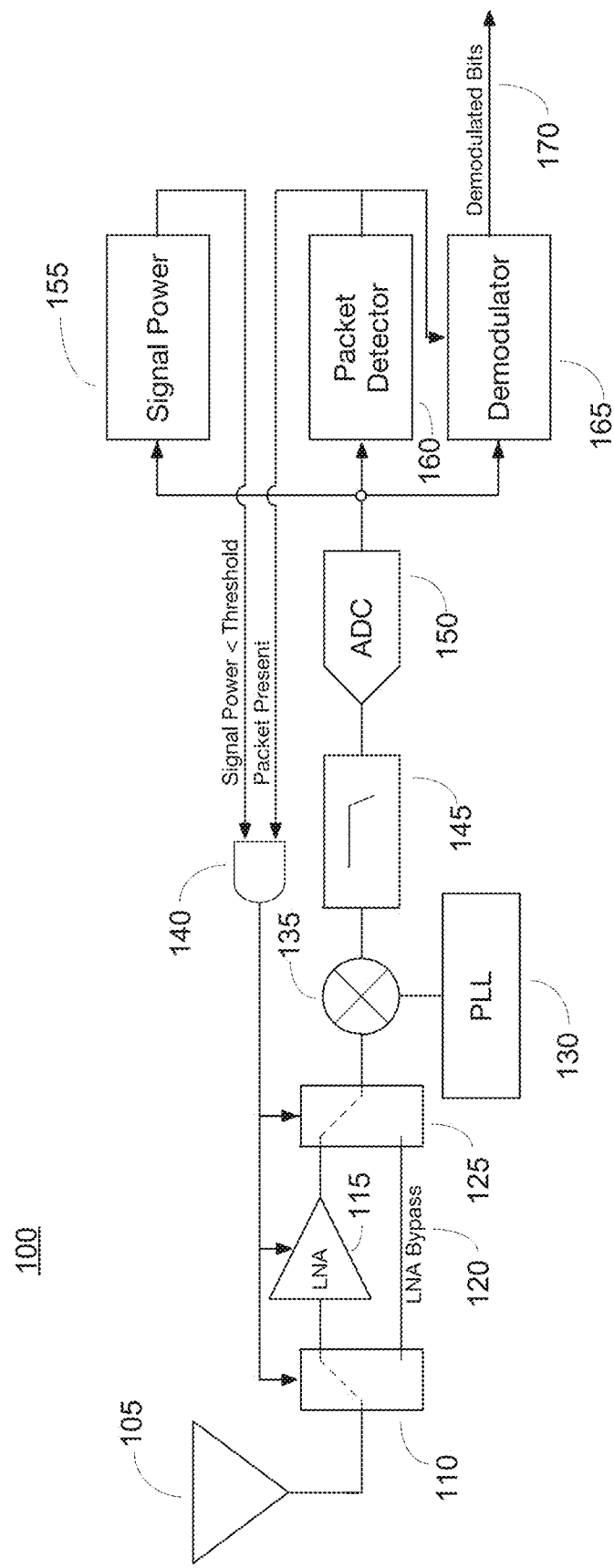
FIG. 1 is a block diagram of a system for receiving and demodulating packets according to exemplary aspects of the present disclosure.

Referring now to the drawings, wherein like reference numerals designate identical or corresponding parts throughout the several views, exemplary aspects of the disclosure include a wireless communication device including an antenna to receive a signal, a low noise amplifier, and circuitry that determines the power level of the signal. The circuitry also determines whether the signal includes a packet, and causes the low noise amplifier to amplify the signal when the signal includes a packet and the power level of the signal is below a threshold. The circuitry also causes the low noise amplifier to be bypassed when the signal does not include a packet, or the power level of the signal is above the predetermined threshold and the signal includes a packet.

FIG. 1 is a block diagram of a system (or device) 100 according to exemplary aspects of the present disclosure. The system includes one or more antennas 105 through which a signal including, for example, a modulated packet is received. The packet may be modulated using quadrature amplitude modulation (QAM) or any other modulation scheme that is known. The signal is provided to a first switch circuit 110 by the antenna 105, and the first switch circuit 110 either provides the signal to an LNA 115 or to a bypass route 120 as will be described in detail below. The outputs of the LNA 115 and the bypass route 120 are both connected to a second switch circuit 125 which selects one of the two outputs and provides the one of the two outputs to a mixer circuit 135. The mixer 135 uses the output of a phase-locked loop circuit 130 to recover the carrier of the signal and to down convert the signal output by the LNA 115 (or the bypass route 120) to, for example, a base band. The output of the mixer circuit 135 is provided to a low pass filter circuit 145 that filters the output to, for example, remove noise components outside the base band, and to band-limit the signal. The output of the filter circuit 145 is provided to an analog-to-digital converter circuit 150 that converts the analog signal into a digital signal, which is then provided in parallel to a signal power detector circuit 155, a packet detector circuit 160 and a demodulator circuit 165.

The signal power detector circuit 155 determines the power level of the received signal. For example, the signal power detector circuit 155 may determine the root-mean-square (RMS) power of the signal (i.e., received packet), the peak power, the mean power, etc. The signal power detector circuit 155 may also calculate the signal-to-noise ratio (SNR) of the received signal. The signal power detector circuit 155 may then compare the determined power value (or SNR value) to a predetermined threshold and generate an output value as a result.

The output of the signal power detector circuit 155, which may be a Boolean value, a digital value, or an analog signal, is provided to a logic AND gate 140. If the output of the signal power detector circuit 155 is an analog value or a digital value (other than a Boolean value), additional circuitry (not shown) may be provided to convert the analog value or digital value into a Boolean value. Examples of the Boolean value provided to the logic AND gate 140 by the signal power detector circuit 155 may include a logic high value (i.e., a "1") when the determined power value is below the predetermined threshold, and a logic low (i.e., a "0") when the determined power value is above the predetermined threshold. In some embodiments, the logic values may be reversed so that a "1" indicates that the determined power value exceeds the predetermined threshold, and a "0" indicates that the determined power value does not exceed the predetermined threshold. Other values and schemes of indicating to the logic AND gate 140 whether the determined power value exceeds the predetermined threshold or not are also possible without departing from the scope of the present disclosure.

The packet detector circuit 160 determines whether the received signal includes a packet that can be correctly decoded or not, as will be described in greater detail below. If the packet detector circuit 160 determines that the signal includes a packet that can be correctly decoded, the packet detector circuit 160 generates a corresponding Boolean value and provides this value to both the logic AND gate 140 and the demodulator circuit 165. The output of the packet detector circuit 160 may take any form, such as those described above with reference to the signal power detector circuit 155. Further explanation of the output is therefore omitted for the sake of brevity.

When the demodulator circuit 165 receives an indication from the packet detector circuit 160 that the signal includes a packet that can be correctly demodulated, the demodulator circuit 165 demodulates the packet contained in the signal in order to obtain demodulated bits at its output 170. As can be appreciated, any form of modulation such as phase-shift keying, frequency-shift keying, amplitude-shift keying, on-off keying, quadrature amplitude modulation, continuous phase modulation, and others are possible without departing from the scope of the present advancements. When the demodulator circuit 165 receives an indication from the packet detector circuit 160 that the signal does not includes a packet that can be correctly demodulated (i.e., a false detection), the demodulator circuit 165 does not demodulate any information in the signal. Instead, the demodulator circuit 165 may enter a low power mode, or may be completely powered down as one of ordinary skill would recognize.

The logic AND gate 140 generates an output (high or low) based on both the output of the signal power detector circuit 155 and the output of the packet detector circuit 160. For example, the AND gate 140 may generate a logic high when both the output of the signal power detector circuit 155 and the output of the packet detector circuit 160 are high, and the AND gate 140 may generate a logic low in all other cases. As can be appreciated, the AND gate may generate a logic low when the outputs of both the signal power detector circuit 155 and the packet detector circuit 160 are high (or when both are low), and the output of the logic AND gate 140 may be high in all other cases. Therefore, the particular logic described herein is merely exemplary and not limiting upon the present disclosure.

The output of the AND gate 140 is provided to both the first and second switches 110 and 125. If, for example, the output of the AND gate 140 is high, indicating that the signal power level does not exceed the predetermined threshold but that the signal contains packets to demodulate/decode, the first and second switches 110 and 125 may connect the LNA 115 between the antenna 105 and the mixer 135. Otherwise, the first and second switches 110 and 125 may connect the bypass route 120 between the antenna 105 and the mixer 135 since there are either no packets to demodulate/decode or the power of the signal is sufficient to allow proper demodulation and decoding of the packets without need for the LNA 115.

The output of the logic AND gate 140 is also provided to the LNA 115. This allows the LNA to power down when the output of the AND gate 140 indicates that the LNA 115 will not be used. Of course, the LNA 115 may also use the output of the AND gate 140 to power up when this output indicates that the LNA 115 will be needed in order to amplify an incoming signal. By use of the bypass route 120 and by powering down the LNA 115 when the bypass route 120 is used, significant power savings may be achieved by the system 100 since the LNA may consume about 20 mW of power or more.

As can be appreciated, the bypass route 120 may be a simple trace that connects an output terminal of the first switch 110 to an input terminal of the second switch 125. However, this trace may also be eliminated and the output terminal of the first switch 110 may be directly connected to the input terminal of the second switch 125 as one of ordinary skill would recognize. Passive components (resistors, capacitors, inductors) may also be included in the bypass route 120 in order to provide a measure of noise suppression without departing from the scope of the present disclosure.

The system 100 may be implemented on a single chip such as an integrated circuit (IC), application specific integrated circuit (ASIC) or even a system on a chip (SoC). The system 100 may also be implemented using discrete components, such as transistors, resistors, capacitors, amplifiers, etc. Of course, a combination of discrete and integrated components may also be used. For example analog portions of the system 100 may be implemented discretely or in an ASIC, while digital portions may be implemented using a field programmable gate array (FPGA) or with a processor executing code (i.e., a digital signal processor, general purpose processor, microcontroller, etc.) Thus, the specific implementation of the system is not limiting upon the present disclosure.

Figure 2:
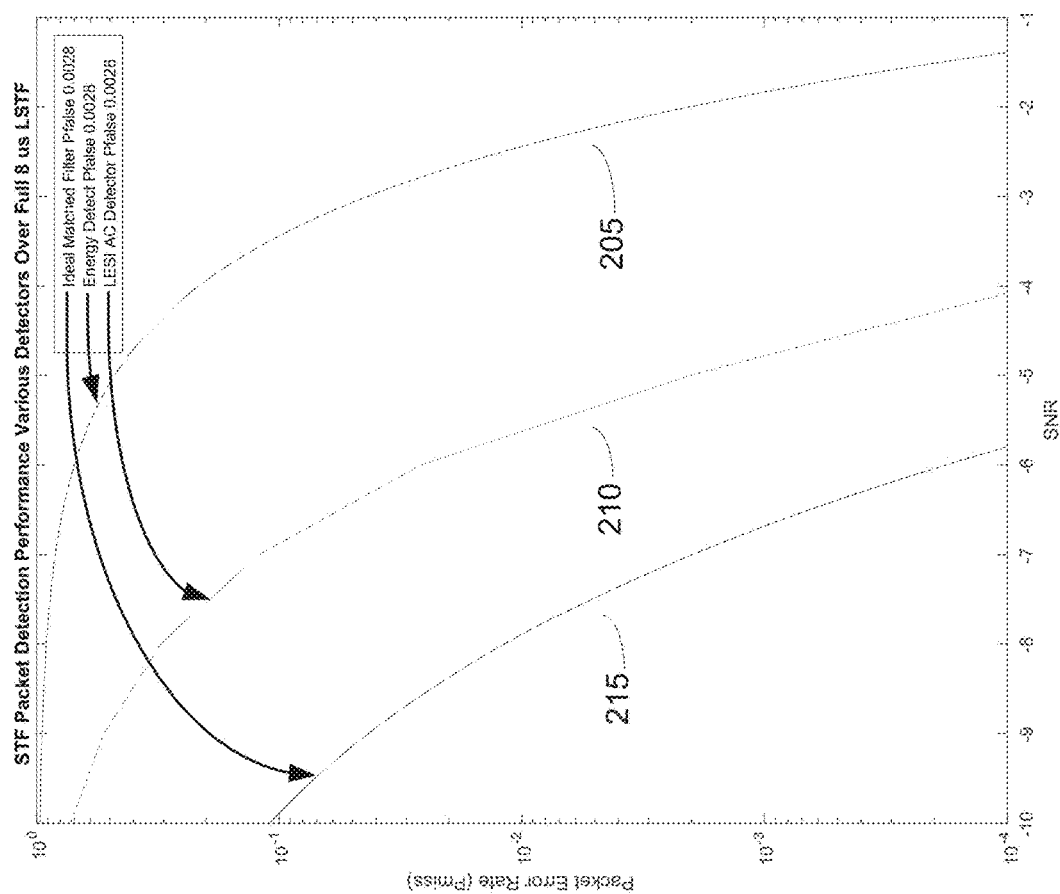
FIG. 2 is a performance comparison of packet detectors according to exemplary, aspects of the present disclosure.

Next, the packet detector circuit 160 is described with reference to FIG. 2. The packet detector circuit 160 needs to be able to detect packets under the channel conditions and data rates that are likely to be experienced by the system 100. For example, for a data rate of 6 Mbps, a modulation and coding scheme (MCS) of 0, and a 10% packet error rate (PER), a sensitivity of −97.9 dBm is needed. If the noise figure is 3 dB, the required SNR is about 1 dB. This requires the packet detector circuit to reliably detect, for example, legacy short training field (L-STF) at a −3 dB SNR (assuming that the cascaded noise figure is 4 dB worse when the LNA is bypassed than when the LNA is not bypassed) with a false detect probability of 0.0028. Of course, one of ordinary skill will recognize this as only one example of the data rates, channel conditions, and modulation schemes that may be encountered by the system 100. Others are also possible such as higher MCSs at 1024 QAM, high throughput short training field (HT-STF), etc. Therefore, the specific example described above is chosen only to illustrate the inventive concepts described herein and should in no way be considered limiting upon the present disclosure.

The packet detector circuit 160 may use a matched filter circuit that spans the entire period of the short training field, for example 8 μs for an L-STF transmission. As illustrated by curve 215 in FIG. 2, the matched filter has a PER of $10^{-4}$ at −6 dB SNR. While this performance may be degraded by unknown carrier frequency offsets (CFO), the matched filter is still able to accurately detect packets under the required conditions. In fact, the matched filter provides excellent performance with relatively low PER at −6 dB SNR and lower as illustrated by the curve 215 in FIG. 2. The matched filter may be a digital filter, such as a finite impulse response (FIR) or infinite impulse response (IIR) filter, implemented on a digital signal processor, FPGA, or may be an analog filter, such as a switched-capacitor filter. As such, the specific implementation of the matched filter is not limiting upon the present disclosure.

The packet detector circuit 160 may also be a simple energy detector that integrates power over the entire period of the short training field (8 μs for L-STF). The energy detector is able to achieve reasonable PER at SNRs above −2 dB, but performance quickly degrades for lower SNRs as illustrated by the curve 205 in FIG. 2. As can be appreciated the energy detector may be an integrator implemented by an analog or digital circuit similar to those circuits described above with regard to the matched filter.

The packet detector circuit 160 may further be a low-end sensitivity improvement (LEST) autocorrelator, which results in sufficiently low PER levels at SNRs down to about −5.5 dB. Thus, the LEST autocorrelator's performance is in between that of the matched filter and the energy detector as illustrated by the curve 210 in FIG. 2.

Figure 3:
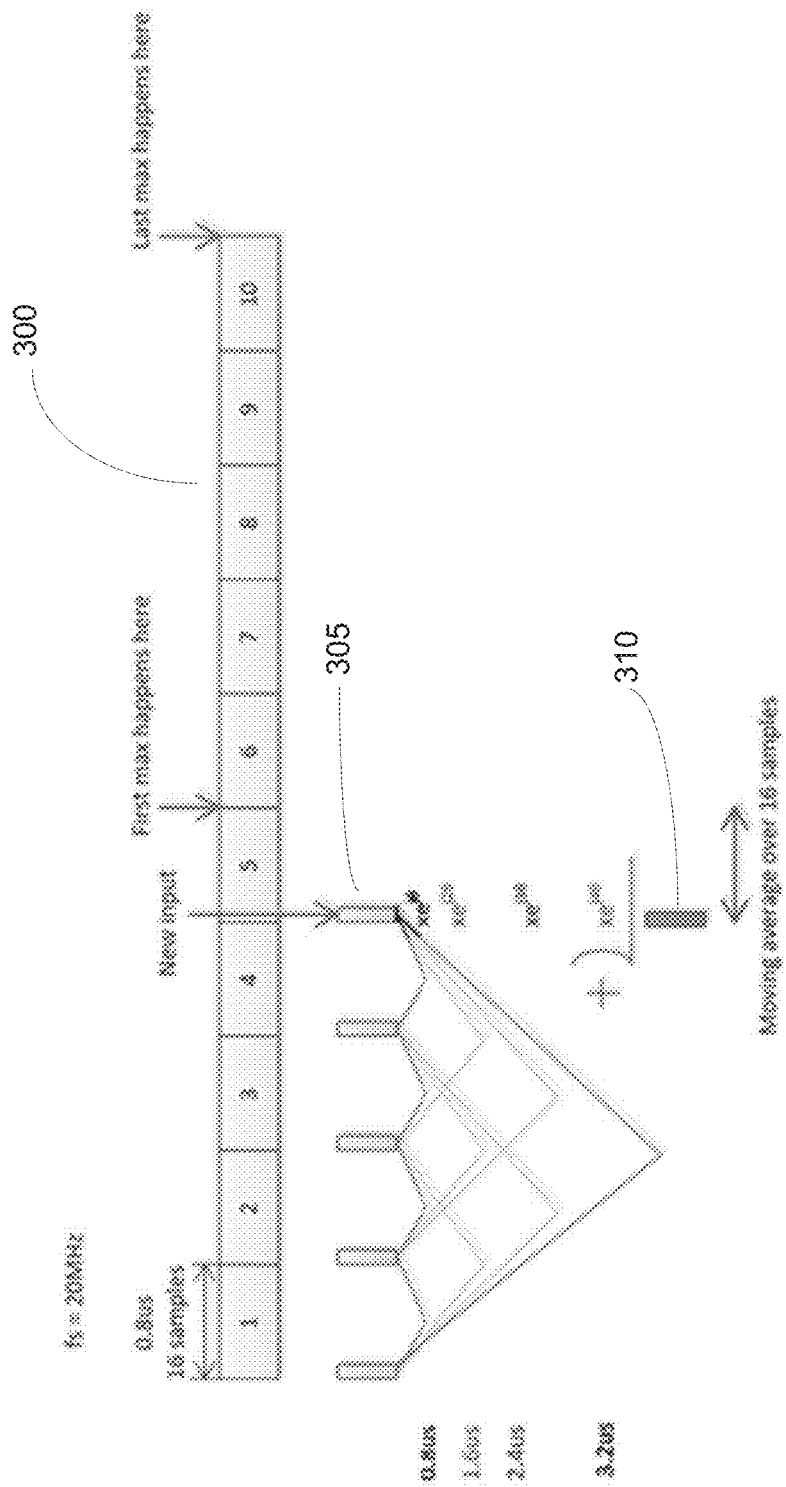
FIG. 3 is a diagram of autocorrelation processing of a packet according to exemplary aspects of the present disclosure.

FIG. 3 illustrates the LEST autocorrelator functionality according to exemplary aspects of the present disclosure. In FIG. 3, an L-STF transmission 300 is divided into ten 16-sample sections, each being 0.8 µs long. The autocorrelation values 305 are then summed for each multiple of 0.8 µs from 1.8 µs to 3.2 µs. In other words, autocorrelations performed every 0.8 µs are added together, autocorrelations performed every 1.6 µs are added together, autocorrelations performed every 2.4 µs are added together, and autocorrelations performed every 3.2 µs are added together. Then the resulting correlation sums (power values) are combined together and averaged over 0.8 µs as illustrated by 310 in FIG. 3. The resulting correlation sums are also combined over all sub-bands in the valid bandwidth and normalized with the power value. Though FIG. 3 shows a moving average window of 16 samples, the window can be any number of samples without limitation. Also, FIG. 3 illustrates that the maximum correlation values will occur between windows 5 and 6, and after window 10. However, with differently sized windows (of more or less than 16 samples) the location of the maximum values, and perhaps even the number of maximum values may change. Therefore, FIG. 3 is merely illustrative and not limiting upon the present disclosure.

Figure 4:
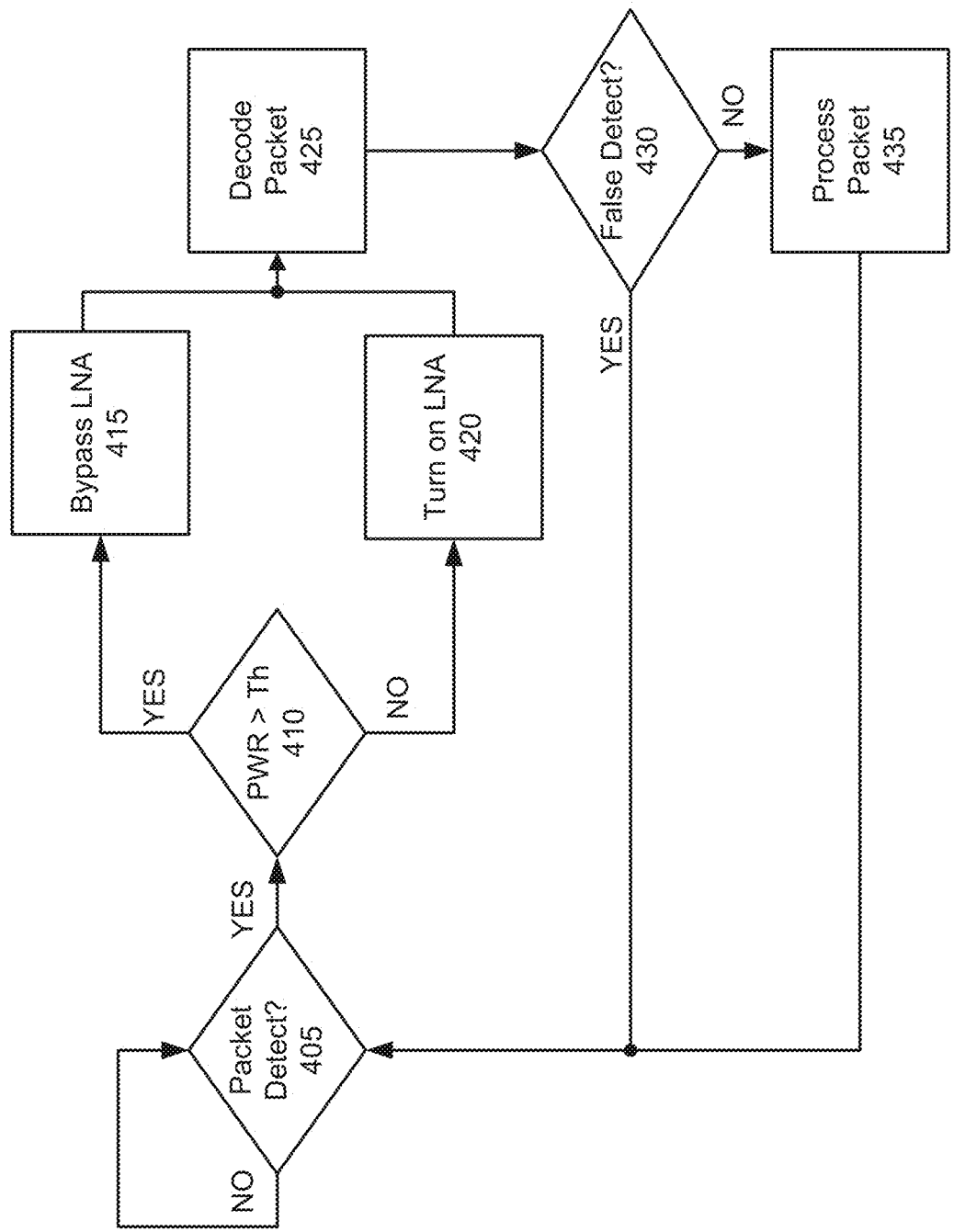
FIG. 4 is an algorithmic flowchart of packet detection according to exemplary aspects of the present disclosure.

FIG. 4 is an algorithmic flow chart of a process performed by the system 100 according to an embodiment. Note that the process in FIG. 4 may be applicable both to low gain listening, such as during carrier search (CRS) or during active reception of data packets. However, the noise figure in dB for 2.4 GHz with the LNA 115 active is 2.12 and with the LNA 115 bypassed is 6 (a difference of 3.88), and the noise figure at 5 GHz with the LNA 115 active is 2.92 and 8 with the LNA 115 bypassed (a difference of 5.08). This means that if the LNA is simply forced off based on historical RSSI, the distance at which communication can take place without significant performance degradation is very short.

Therefore, the LNA 115 may be turned off (i.e., bypassed) during CRS, and once a packet is detected a decision may be made as to whether to turn on the INA 115 or not based on signal strength at that time. This effectively expands the range at which communication can take place without significant performance degradation. For example, a MCS 0 the expected degradation is about 4 dB with the INA 115 bypassed. However, at MCS 1 and higher there is no significant loss. This mode of maintaining the LNA 115 off (bypassed) during CRS and then determining whether to use the LNA 115 or not is denoted as the low gain listen mode herein, and is the mode described with reference to FIG. 4.

In FIG. 4, the system 100 awaits detection of a packet from a received signal at step 405. If no packet is detected, the system 100 loops back to step 405. If, however, a packet is detected, the system proceeds to step 410 where the power level of the packet is determined and compared to a predetermined threshold. If the packet's power level exceeds the threshold, the system proceeds to step 415 to bypass and turn off the LNA 115 (or to maintain the LNA off). Received packets are then decoded/demodulated at step 425. Of course, the packet detector circuit 160 may determine that the packet detection was in error, and that the received transmission does not include a packet that can be decoded/demodulated. If, at step 430, a false packet detection is deemed to have occurred, the system 100 reverts to step 405 to await reception of another packet. If, however, at step 430 it is determined that no false detection has occurred, the system 100 proceeds to step 435 to decode/demodulate the packet. Then the system reverts to step 405 to await reception of another transmission.

Returning to step 410, if the system 100 determines that the power level of the packet is at or below the predetermined threshold, the system 100 may turn on the LNA 115 and switch off the bypass route 120 in order to have the LNA 115 amplify the received transmission. Then the process continues to step 425 to decode the packet, step 430 to determine whether there was a false detection of the packet, and step 435 to process the packet as described above.

In the above description of FIG. 4, the individual blocks are described sequentially solely for clarity and ease of understanding. As one of ordinary skill will recognize, one or more blocks in FIG. 4 may be performed in parallel, in a different order than that described, or in reverse order. One or more blocks may also be omitted depending on the required functionality. Therefore, the algorithmic method described with reference to FIG. 4 is merely exemplary and not limiting upon the present disclosure.

The system 100 is able to maintain the LNA 115 off during CRS for about 95% of the time with minimal or no errors in detection, especially for an MCS of 1 or more. The system 100 may also be able to maintain the LNA 115 off during active reception of packets as long as the received packets continue to have sufficient RSSI. Therefore, power level for each packet may computed throughout active reception in order to determine whether the LNA 115 can be switched of or not, and the LNA 115 may be maintained off unless and until it is needed. Table 1 below, shows different networks and the percentage of packets transmitted in the network that meet or exceed the required. RSSI in order to turn the LNA 115 off.

TABLE 1

| Network Type | RSSI Level for LAN Bypass | % of Packets at RSSI Level for LNA Bypass |
|---|---|---|
| HT20 | −64 dBm | 93% |
| VHT80, MCS7 | −58 dBm | 84% |
| VHT80, MCS11 | −43 dBm | 10% |

Figure 5:
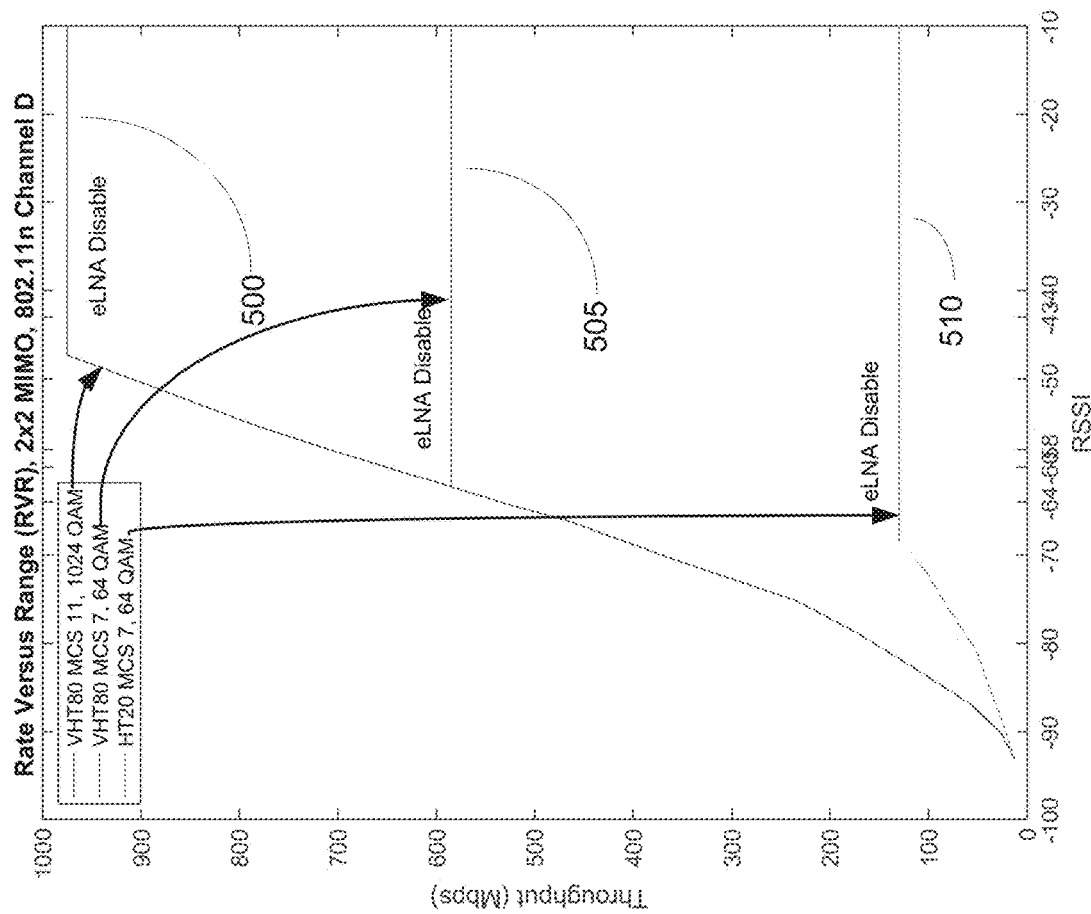
FIG. 5 is a comparison of throughput for different coding schemes according to exemplary aspects of the present disclosure.

Based on the table above, and as illustrated in FIG. 5, the LNA 115 may be turned off anywhere between 10% and 93% of the time, depending on network, without degrading performance. In FIG. 5, the line 510 corresponds to HT20, the line 505 corresponds to VHT80, MCS7, and the line 500 corresponds to VHT80, MCS11.

In the case of 802.11, unassociated, packets sent in the basic rates of 1, 2, 5.5 and 11 Mbps (802.11b) or 6, 9, 12, 18, 24, and 36 Mbps (802.11a), the required RSSI for turning off the LNA 115 is −72 dBm. The percentage of packets meeting or exceeding this RSSI is provided in Table 2 below:

TABLE 2

| Conditions | % of Packets Above −72 dBm |
|---|---|
| Enterprise Office, 5 GHz | 97% |
| Airports, 5 GHz | 33% |
| Market, 5 GHz | 30% |
| Outdoors, 5 GHz | 25% |

Thus, with 802.11 the LNA 115 may be turned off between 25% and 97% of the time depending on network environment and conditions. Furthermore, for systems with higher noise figure (NF), such as 7 dB in both bands, this may result in a cascaded 7-8 dB NF degradation when the LNA 115 is bypassed. This may be more than what can be recovered through improved detection. Therefore, there may be a sensitivity loss of 2-3 dB for 6 Mbps, but no loss for higher rates, 802.11b rates will also not lose sensitivity because the very long preambles used still allow for correct detection. Table 3 below shows the noise figures with and without the LNA, and the corresponding loss in sensitivity.

TABLE 3

|  | Cascaded NF with LNA | Cascaded NF with LNA Bypass | Delta | 6 MPS Sens. Loss with memory AGC | DSSS/CCK Sens. Loss with memory AGC |
| --- | --- | --- | --- | --- | --- |
| 2.4 GHz | 2.39 dB | 10 dB | 7.88 dB | 2.88 | 0 |
| 5 GHz | 3.71 dB | 10.5 dB | 6.79 dB | 1.79 | 0 |

In table 3, DSSS is direct sequence spread spectrum and CCK is complementary code keying. One core listen technique includes performing CRS with a single receive chain (on a client having two or more receive chains) to save power. This is one core listen since only one core is performing the low gain listen, for example. Napping may also be used to turn the circuits performing CRS off for brief periods to further save power during CRS. Both one core listen and napping may be used with the inventive concepts described herein to further lessen power consumption.

Table 3 also refers to memory automatic gain control, or memory AGC. Memory AGC works on prior knowledge (from measurement during a previous time period, for example) that the RSSI of a packet will be above a predetermined threshold when the system 100 is associated with a known access point. This level is referred to herein as minRSSI. As long as the minRSSI is greater that the lowest rate sensitivity of the system 100, CRS trade-offs may be made in order to save power. Such trade-offs include bypassing the LNA, napping and/or one core listen since all of these techniques may impact low rate sensitivity as described above.

A connection may also be evaluated in terms of an SNR limit, maxSNR. The limit maxSNR is the limit at which packets will be sent. In other words, no packets that require an SNR greater than maxSNR will be sent, in certain applications, maxSNR may be updated dynamically, such as for a basic rate control frame (i.e., an ACK frame). Both minRSSI and maxSNR may be used to determine whether the LNA may be bypassed or not.

In other exemplary aspects, the LNA may be turned off during packet reception. This can be used during reception of, for example, HT-STF (including very high throughput SIT (VHT-STF), HE-STF, etc.) In these cases the rate is learned during the SIGA field, and this information can be used to turn the LNA off if SNR is sufficient.

As can be appreciated the inventive concepts described herein significantly increase power savings since the LNA may be powered down for great lengths of time. This may lead to elimination of bulk acoustic wave (BAW) or film bulk acoustic resonators (FBAR) in front of the LNA in favor of a higher power LNA and more filtering behind the LNA. Though in this case the LNA may consume more power, the overall system consumes less power since the LNA is off most of the time.

Though standards, such as IEEE 802.11, are referred to in the above descriptions, the inventive concepts described herein are applicable to all forms and protocols of wireless communications. For example, the inventive concepts described herein may also be used in Bluetooth communication, near-field communication, and the like. Thus, reference to any specific communication is merely exemplary and not limiting upon this disclosure.

Next, an exemplary hardware device that may include a system 100 is described with reference to FIG. 6. As can be appreciated, this device may be a cellular phone, smart phone, personal organizer, tablet, laptop computer, desk top computer, ebook reader, and the like. The device may also be a communication device integrated into, for example, a car, boat, plane, etc. The device may also be an access point, hotspot, base station, eNB, and any other communication device without departing from the scope of the present disclosure.

Figure 6:
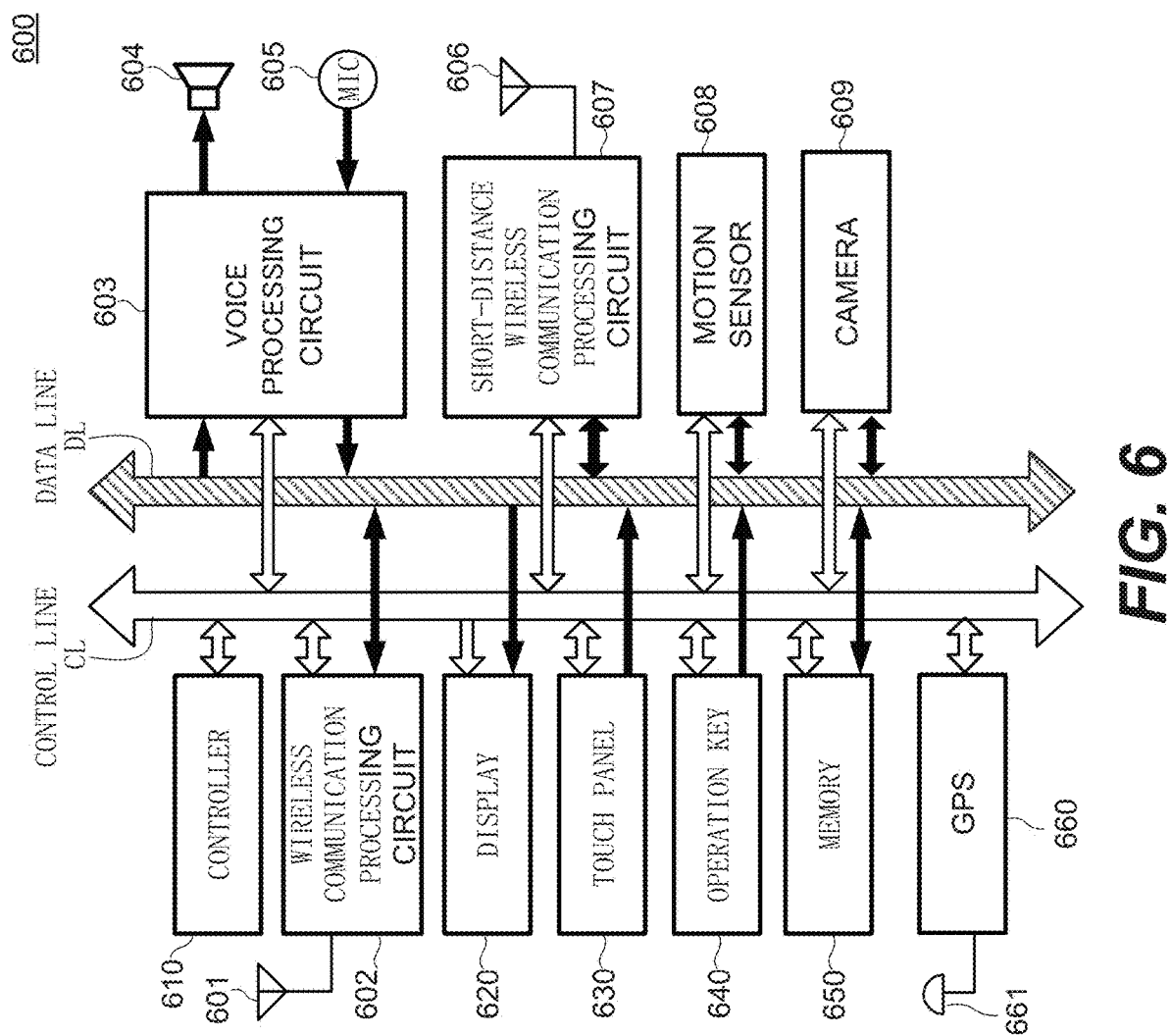
FIG. 6 is a block diagram of the hardware circuitry of a system according to exemplary aspects of the present disclosure.

The device 600 in FIG. 6 includes a controller 610, which may be a general purpose processor circuit or microcontroller, or a software implemented controller on, for example, an FPGA. The device 600 also includes memory 650, including any combination of RAM, ROM, EPROM, EEPROM, FLASH memory, etc., to store instructions and information used by the controller 610. The device 600 also includes human interfaces such as a display 620, a touch panel 630, keys 640, and voice processing circuitry 603 connected to a speaker 604 and a microphone 605. A motion sensor 608 and GPS circuitry 660 may also be used to determine an orientation and location of the device 600. A camera 609 is also included for image capture. The components of the device 600 are interconnected by a control line CL which communicates control information to configure the components, and by a data line DL through which data is communicated among the components.

A wireless communication processing circuit 602 is connected to an antenna 601 in order to perform wireless communication over, for example, a cellular network such as 3G, 4G, LTE, or LTE-A networks. The wireless communication processing circuit 602 may also communicate via Wifi. A system 100 may be implemented in the wireless communication processing circuit 602 in order to decrease its power consumption.

Another wireless communication processing circuit 607 is also included in the device 600 in order to perform short-distance communication, such as Bluetooth or near-field communication (NFC). The system 100 described herein may also be included in the wireless communication processing circuit 607. As can be appreciated, the wireless communication circuits may also be combined into a single circuit for performing all wireless communication.

To the extent that the above descriptions may be deemed to describe separate embodiments, the organization of the description into embodiments is merely for ease of understanding of the inventive concepts described herein. As such the features of each embodiment may be combined with features of the other embodiments without limitation. Obviously, numerous modifications and variations of the present invention are possible in light of the above teachings. It is therefore to be understood that within the scope of the appended claims, the invention may be practiced otherwise than as specifically described herein.

The invention claimed is:

1. A wireless communication device, comprising:
a low noise amplifier;
circuitry configured to
determine a power level of a received signal;
determine whether the signal includes a packet; and
a logic AND gate configured to cause the low noise amplifier to amplify the signal when the signal includes a packet and the power level of the signal is below a predetermined threshold; and cause the low noise amplifier to be bypassed when the signal does not include a packet, or the power level of the signal is above the predetermined threshold and the signal includes a packet.

2. The wireless communication device of claim 1, wherein the circuitry is configured to cause the low noise amplifier to be turned off and bypassed during a carrier search.

3. The wireless communication device of claim 1, wherein the circuitry configured to determine whether the signal includes a packet includes a matched filter.

4. The wireless communication device of claim 1, wherein the circuitry configured to determine whether the signal includes a packet includes an energy detector with power integrated over a short training field.

5. The wireless communication device of claim 1, wherein the circuitry configured to determine whether the signal includes a packet includes a low-end sensitivity improvement autocorrelator.

6. The wireless communication device of claim 1, wherein the circuitry is configured to cause the low noise amplifier to be turned off and bypassed when the signal does not include a packet, or the power level of the signal is above the predetermined threshold and the signal includes a packet.

7. A wireless communication device comprising:
a low noise amplifier; and
circuitry configured to
determine a power level of a received signal;
determine whether the received signal includes a packet;
cause the low noise amplifier in the wireless communication device to amplify the received signal when the received signal includes a packet and the power level of the received signal is below a predetermined threshold;
cause the low noise amplifier in the wireless communication device to be bypassed when the received signal does not include a packet, or the power level of the received signal is above the predetermined threshold and the received signal includes a packet; and
cause the low noise amplifier to be turned off and bypassed during a carrier search by the wireless communication device.

8. The wireless communication device of claim 7, wherein the circuitry configured to determine whether the received signal includes a packet uses a matched filter.

9. The wireless communication device of claim 7, wherein the circuitry configured to determine whether the received signal includes a packet uses an energy detector with power integrated over a short training field.

10. The wireless communication device of claim 7, wherein the circuitry configured to determine whether the received signal includes a packet uses a low-end sensitivity improvement autocorrelator.

11. The wireless communication device of claim 7, wherein the circuitry is further configured to:
cause the low noise amplifier to be turned off and bypassed when the signal does not include a packet, or the power level of the signal is above the predetermined threshold and the signal includes a packet.

12. A wireless communication device, comprising:
an antenna for receiving a signal;
a low noise amplifier;
a bypass route;
a first switch configured to selectively couple the antenna to either a first input of the low noise amplifier or the bypass route;
a mixer;
a second switch configured to selectively couple an input of the mixer to either an output of the low noise amplifier or the bypass route;
a filter having an input coupled to an output of the mixer;
an analog-to-digital converter having an input coupled to an output of the filter;
signal power detector circuitry having an input coupled to an output of the analog-to-digital converter, wherein the signal power detector circuitry is configured to determine the power level of the received signal;
packet detector circuitry having an input coupled to the output of the analog-to-digital converter, wherein the packet detector circuitry is configured to determine whether the received signal includes a packet; and
a logic gate having a first input coupled to an output of the signal power detector circuitry, a second input coupled to the packet detector circuitry and an output coupled to an input of the first switch, an input of the second switch and a second input of the low noise amplifier, the logic gate configured to:
cause the first switch to couple the antenna to the first input of the low noise amplifier, cause the second switch to couple the input of the mixer to the output of the low noise amplifier and cause the low noise amplifier to amplify the received signal when the received signal includes a packet and the power level of the received signal is below a predetermined threshold, and
causes the first switch to couple the antenna to the bypass route and the second switch to couple the input of the mixer to the bypass route when the received signal does not include a packet, or when the power level of the received signal is above the predetermined threshold and the received signal includes a packet.

13. The wireless communication device of claim 12, wherein the logic gate is further configured to cause the first switch to couple the antenna to the bypass route and the second switch to couple the input of the mixer to the bypass route and cause the low noise amplifier to be turned off during a carrier search.

14. The wireless communication device of claim 12, wherein the packet detector circuitry includes a matched filter.

15. The wireless communication device of claim 12, wherein the packet detector circuitry includes an energy detector with power integrated over a short training field.

16. The wireless communication device of claim 12, wherein the packet detector circuitry includes a low-end sensitivity improvement autocorrelator.

17. The wireless communication device of claim 12, wherein the logic gate is further configured to cause the first switch to couple the antenna to the bypass route and the second switch to couple the input of the mixer to the bypass route and cause the low noise amplifier to be turned off when the wireless communication device is within range of an access point having an associated stored power level above a first predetermined threshold.

* * * * *